(12) United States Patent
Chen et al.

(10) Patent No.: US 11,289,793 B2
(45) Date of Patent: Mar. 29, 2022

(54) SEMICONDUCTOR PACKAGING STRUCTURE HAVING ANTENNA MODULE

(71) Applicant: SJ Semiconductor (Jiangyin) Corporation, Jiangyin (CN)

(72) Inventors: Yenheng Chen, Jiangyin (CN); Chengchung Lin, Jiangyin (CN); Chengtar Wu, Jiangyin (CN); Jangshen Lin, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 784 days.

(21) Appl. No.: 16/211,039

(22) Filed: Dec. 5, 2018

(65) Prior Publication Data

US 2019/0181534 A1   Jun. 13, 2019

(30) Foreign Application Priority Data

Dec. 7, 2017   (CN) .......................... 2017216860384

(51) Int. Cl.
| | |
|---|---|
| *H03M 1/38* | (2006.01) |
| *H01Q 1/22* | (2006.01) |
| *H01Q 1/38* | (2006.01) |
| *H01L 23/49* | (2006.01) |
| *H01L 23/31* | (2006.01) |
| *H01L 23/66* | (2006.01) |

(52) U.S. Cl.
CPC ....... *H01Q 1/2283* (2013.01); *H01L 23/3114* (2013.01); *H01L 23/49* (2013.01); *H01L 23/66* (2013.01); *H01Q 1/38* (2013.01)

(58) Field of Classification Search
CPC .......................... H01Q 1/2283; H01L 23/3114
USPC .................................................. 343/700 RR
See application file for complete search history.

(56) References Cited

U.S. PATENT DOCUMENTS

2017/0040266 A1* 2/2017 Lin ..................... H01L 23/5385

* cited by examiner

*Primary Examiner* — Peguy Jean Pierre
(74) *Attorney, Agent, or Firm* — Alston & Bird LLP

(57) ABSTRACT

The present disclosure provides a semiconductor packaging structure having an antenna module, comprising: a substrate having a first surface and a second surface opposite to the first surface; a redistribution layer located on the first surface of the substrate; a metal bump located on one side, insulated from the substrate, of the redistribution layer, and electrically connected with the redistribution layer; a semiconductor chip disposed on a surface, insulated from the substrate, of the redistribution layer, and electrically connected with the redistribution layer, a space is configured between the semiconductor chip and the metal bump; and an antenna module located on the second surface of the substrate.

11 Claims, 3 Drawing Sheets

SEMICONDUCTOR PACKAGING STRUCTURE HAVING ANTENNA MODULE

CROSS REFERENCES TO RELATED APPLICATIONS

This application claims the benefit of priority to Chinese Patent Application No. CN2017216860384, entitled "Semiconductor Packaging Structure Having Antenna Module", filed with SIPO on Dec. 7, 2017, the contents of which are incorporated herein by reference in its entirety.

TECHNICAL FIELD

The present disclosure relates to the technical field of semiconductor packaging, and in particular, to a semiconductor packaging structure having an antenna module.

BACKGROUND

With the increasing of function, performance and integration of integrated circuits, and the emergence of new integrated circuits, packaging technology plays an increasingly important role in integrated circuit products, and amounts for an increasing proportion in the value of the entire electronic system. At the same time, with the characteristic size of integrated circuits reaching a nanometer level, transistors are developing towards higher density and higher clock frequency, and packaging is also developing towards higher density.

Fan-out wafer level packaging (FOWLP) technology has the advantages of miniaturization, low cost and high integration, as well as better performance and higher energy efficiency. It has become an important packaging method for electronic devices such as those used in high-requirement mobile/wireless networks, and it is one of the most promising packaging technologies at present. In addition, for the consideration of communication effect, radio frequency chips are always provided with antennas in use. However, most of the existing radio frequency antennas are laid out directly on the PCB during layout design for radio frequency function modules or interfaces for external antennas are reserved during layout design. In order to ensure the antenna gain, this method must be at the expense of the PCB area. In addition, it is difficult to control the warpage of fan-out wafer level packaging by adopting processes such as plastic packaging, the warpage situation is difficult to be alleviated, material shrinkage or swelling which may cause problems such as slippage and dislocation in the packaging process is also difficult to control, the heat conductivity is poor, and the problems such as heat effect may be caused.

Therefore, it is necessary to provide a low-cost semiconductor packaging structure having antennas to solve the warpage problems that easily occur and the overheating effect caused by poor heat conductivity.

SUMMARY

The present disclosure provides a semiconductor packaging structure having an antenna module, comprising: a substrate having a first surface and a second surface opposite to the first surface; a redistribution layer located on the first surface of the substrate; a metal bump located on one side, insulated from the substrate, of the redistribution layer, and electrically connected with the redistribution layer; a semiconductor chip disposed on and electrically connected with the redistribution layer, wherein a spacing is configured between the semiconductor chip and the metal bump; and an antenna module located on the second surface of the substrate.

As a preferred solution of the present disclosure, the semiconductor packaging structure further comprises an underfill layer, and the underfill layer fully fills a gap between the semiconductor chip and the redistribution layer.

As a preferred solution of the present disclosure, the substrate comprises a quartz glass substrate or a sapphire substrate.

As a preferred solution of the present disclosure, the redistribution layer specifically comprises: a dielectric layer bonded to the first surface of the substrate; one metal wire layer located inside the dielectric layer; and an under-bump metal layer located on a surface, insulated from the substrate, of the dielectric layer, extending to the inside of the dielectric layer and electrically connected with the metal wire layer, wherein the metal bump is provided on the under-bump metal layer.

As a preferred solution of the present disclosure, the metal bump comprises: a copper pole, a nickel layer located on an upper surface of the copper pole and a solder bump located on the nickel layer.

As a preferred solution of the present disclosure, the antenna module comprises a plurality of antenna units and each antenna unit has a same outer contour.

As a preferred solution of the present disclosure, the antenna units are arranged in an array, arranged in a ring shape or irregularly arranged on the second surface of the substrate.

As a preferred solution of the present disclosure, the antenna units are arranged in a hexagonal honeycomb shape on the second surface of the substrate, and each of the antenna units is disposed with a space from adjacent antenna units.

As a preferred solution of the present disclosure, the shape of the cross section, along the surface of the substrate, of the antenna units comprises a hexagonal shape.

As a preferred solution of the present disclosure, the antenna module comprises at least two layers of antenna module units, and each layer of the antenna module units at least comprises one antenna unit.

DESCRIPTION OF COMPONENT REFERENCE SIGNS

Figure 1:
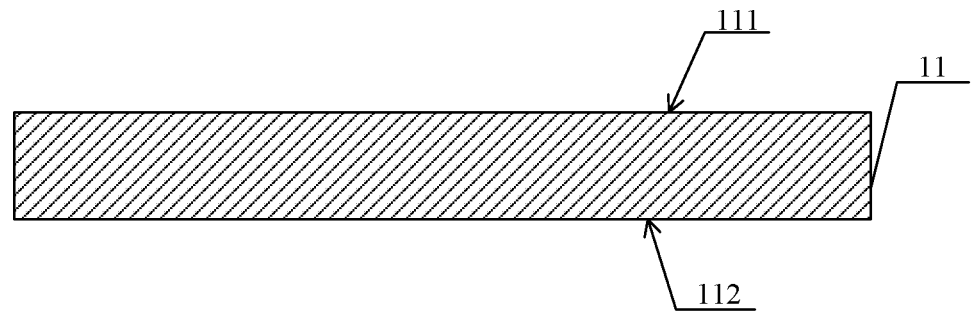
FIG. 1 illustrates a cross sectional view of a substrate.
Figure 2:
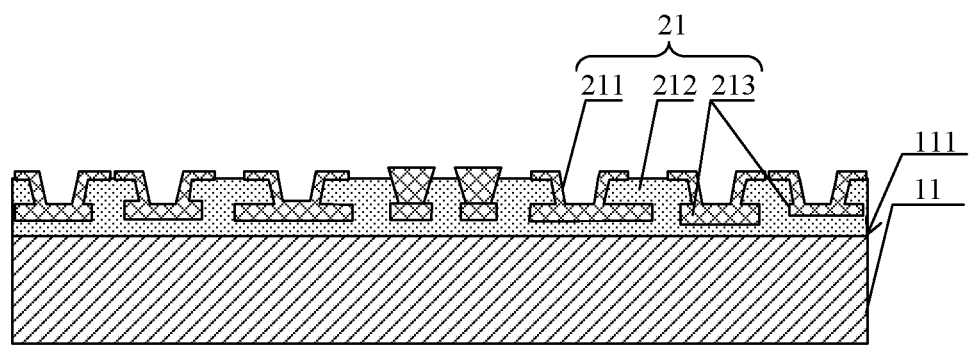
FIG. 2 illustrates a cross sectional view after a redistribution layer is formed in preparation of a semiconductor packaging structure according to the present disclosure.
Figure 3:
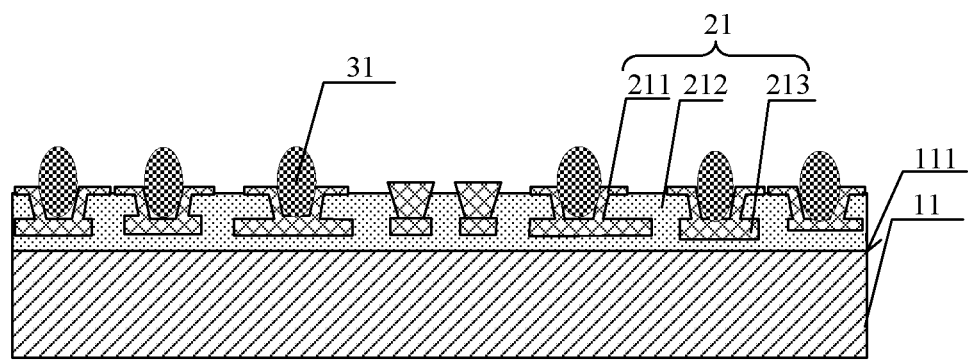
FIG. 3 illustrates a cross sectional view after a metal bump is formed during preparation of a semiconductor packaging structure according to the present disclosure.
Figure 4:
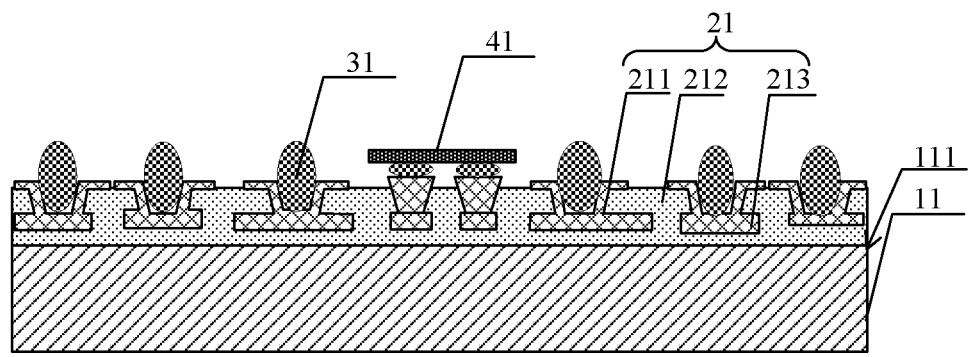
FIG. 4 illustrates a cross sectional view after a semiconductor chip is formed in preparation of a semiconductor packaging structure according to the present disclosure.
Figure 5:
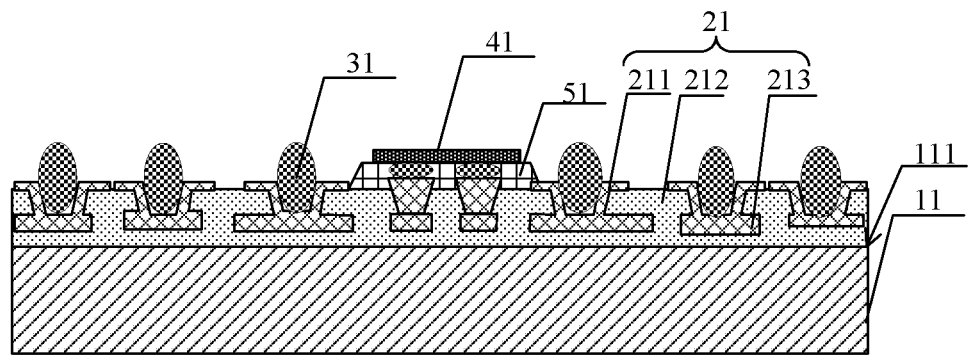
FIG. 5 illustrates a cross sectional view after an underfill layer is formed in preparation of a semiconductor packaging structure according to the present disclosure.
Figure 6:
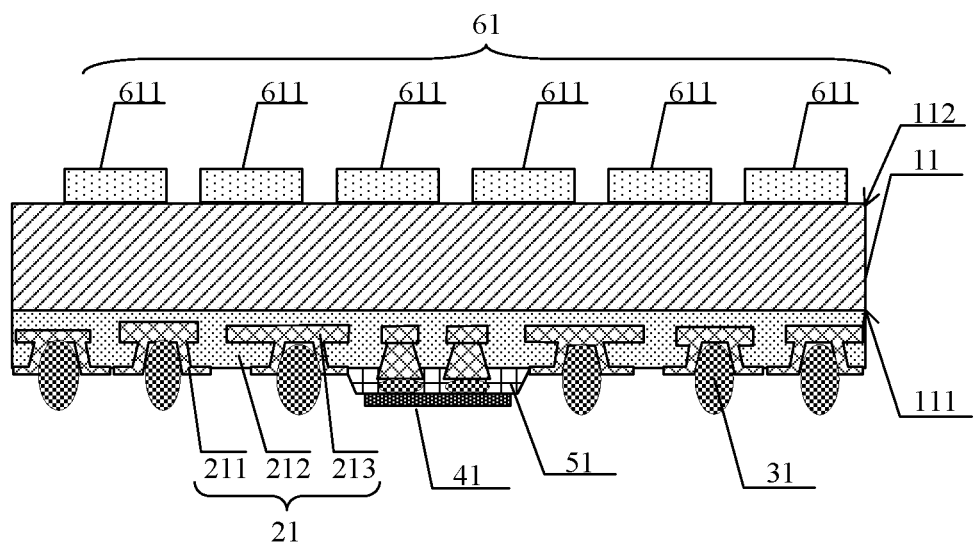
FIG. 6 illustrates a cross sectional view after an antenna module is formed in preparation of a semiconductor packaging structure according to the present disclosure.

11 Substrate
111 First surface

112 Second surface
21 Redistribution layer
211 Under-bump metal layer
212 Dielectric layer
213 Metal wire layer
31 Metal bump
41 Semiconductor chip
51 Underfill layer
61 Antenna module
611 Antenna unit

DETAILED DESCRIPTION OF THE PREFERRED EMBODIMENTS

The implementation modes of the present disclosure will be described below through specific embodiments. One skilled in the art can easily understand other advantages and effects of the present disclosure according to content disclosed in the description.

Referring to FIG. 1 to FIG. 7. It shall be noted that the structures, scales, sizes and the like illustrated in the drawings of the description are only used for cooperating with the contents disclosed in the description to allow one skilled in the art to understand and read instead of limiting the implementable limitation conditions of the present disclosure, and thus have no technical substantive meanings; and any structural modifications, changes of scaling relations or adjustments to sizes shall still fall into the scope which can be covered by the technical contents disclosed by the present disclosure under the situation that the effects which can be produced by the present disclosure and the purposes which can be achieved by the present disclosure are not influenced. In addition, words such as "above", "below", "left", "right", "middle" and "one" cited in the description are just used for facilitating clear description instead of limiting the implementable scope of the present disclosure. Changes or adjustments of relative relations thereof shall also be deemed as the implementable scope of the present disclosure under the situation that the technical contents are not substantively changed.

As illustrated in FIGS. 1-7, the present disclosure provides a semiconductor packaging structure having an antenna module, comprising:
a substrate 11 having a first surface 111 and a second surface opposite to the first surface 112;
a redistribution layer 21 located on the first surface 111 of the substrate 11;
a metal bump 31 located on one side, insulated from the substrate 11, of the redistribution layer 21, and electrically connected with the redistribution layer 21;
a semiconductor chip 41 located on a surface of one side, insulated from the substrate 11, of the redistribution layer 21, and electrically connected with the redistribution layer 21, wherein a spacing is between the semiconductor chip 41 and the metal bump 31; and
an antenna module 61 located on the second surface 112 of the substrate 11.

As an example, the substrate 11 comprises a quartz glass substrate or a sapphire substrate.

Specifically, the present disclosure provides a semiconductor packaging structure, wherein the substrate 11 is preferably a quartz substrate or a sapphire substrate. On the one hand, since the quartz sheet has no warping problem, the semiconductor chip can be prevented from being broken, warped and cracked in the subsequent preparation process; on the other hand, quartz has good heat conductivity, which is ten to hundred times better than that of MC, thus the problem of heat effect in the packaging process will be solved. In addition, in other examples, the substrate may also be any other glass substrates, which are not specifically limited here.

The shape of the substrate 11 may be set according to actual needs. The shape of the substrate 11 may be a rectangular shape, a circular shape, a hexagonal shape, a triangular shape, a trapezoidal shape or the like, which is not limited here.

Specifically, the semiconductor chip 41 may be any kind of semiconductor functional chip, a connection pad electrically leading out its internal functional devices is further formed on the front surface of the semiconductor chip 41, the connection pad is exposed to the front surface of the semiconductor chip, and preferably, an upper surface of the connection pad is leveled with the upper surface of the semiconductor. The spacing between the semiconductor chip 41 and the metal bump 31 refers to the semiconductor chip is spaced with the metal bump at a position that protrudes out of the metal wiring layer on the surface, insulated from the substrate, of the metal wiring layer, i.e., the exposed exterior part is not conductive.

In addition, since structures such as the antenna module, the redistribution layer, the metal bump and the semiconductor chip are provided on two opposite side surfaces of the substrate in the present disclosure, reasonable design of the antenna structure can be performed, which will facilitate the decrease of the volume of the entire semiconductor packaging structure.

As an example, the semiconductor packaging structure further comprises an underfill layer 51, and the underfill layer 51 fully fills the gap between the semiconductor chip 41 and the redistribution layer 21.

Specifically, the underfill layer 51 is filled between the semiconductor chip 41 and the adjacent redistribution layer 21, and completely covers the surface, close to the redistribution layer 21, of the semiconductor chip 41. Preferably, the underfill layer 51 exceeds the surface of the semiconductor chip and extends to the periphery of the metal bump on the two sides of the semiconductor chip, the material of the underfill layer 51 includes filling adhesive, the underfill layer 51 can protect the adhesion force and stability of the semiconductor chip in the process, can further alleviate the problem of stress concentration at the edge and the apex of the semiconductor chip, and can prevent the semiconductor chip from being broken, and thus improving the packaging reliability.

As an example, the structure of the redistribution layer 21 specifically comprises:
a dielectric layer 212 bonded to the first surface 111 of the substrate;
at least one metal wire layer 213 located inside the dielectric layer 212; and
an under-bump metal layer 211 located on a surface, insulated from the substrate 11, of the dielectric layer 212, extending to the inside of the dielectric layer 212 and electrically connected with the metal wire layer 213, wherein the metal bump 31 is provided on the under-bump metal layer 211.

Specifically, in one example, the redistribution layer 21 comprises a metal wire layer 213, a dielectric layer 212, and an under-bump metal layer 211. In one example, the fabrication process thereof comprises: firstly forming a metal wire layer on one surface of the substrate, and then forming a dielectric layer on the surface. The dielectric layer packages the metal wire layer. Alternatively, first forming a dielectric layer; then performing processes such as etching and filling; after that, forming an opening in the dielectric layer, such that the under-bump metal layer can be prepared. The redistribution layer is capable of realizing an electric connection leading-out function prepared by other processes.

In addition, in other examples, the dielectric layers may have two or more layers, and the metal wire layers may have two or more layers. For example, a first insulating layer is formed on the surface of the substrate; the metal wire layer is formed on a surface, insulated from the substrate, of the first insulating layer; a second insulating layer is formed on the upper surface of the first insulating layer, and the second insulating layer completely covers the metal wire layer; an opening is formed in the second insulating layer and the opening exposes the metal wire layer; and the under-bump metal layer is formed in the opening.

Specifically, the material of the metal wire layer 213 may be, but not limited to, one of copper, aluminum, nickel, gold, silver and titanium or a laminated layer formed by more than two of the above material. The material of the dielectric layer 212 may be a low-k dielectric material, in particular, may include any one of epoxy resin, silica gel, PI, PBO, BCB, silica, phosphorus silica glass and fluorine glass.

As an example, the structure of the metal bump 31 comprises: a copper pole, a nickel layer located on an upper surface of the copper pole and a solder bump located on the nickel layer.

Specifically, the metal bump 31 may be a metal pole, a solder ball, or a combination of a copper pole and a solder metal, etc. In this embodiment, a metal bump 31 is provided, and a preparation method comprises: fabricating an under-bump metal layer on the redistribution layer; forming a copper pole on the surface of the under-bump metal layer; forming a metal barrier layer on the surface of the copper pole; forming a solder metal on the surface of the metal barrier layer, and forming a solder bump on the surface of the metal barrier layer by adopting a high-temperature reflow process.

Herein, the metal barrier layer comprises a nickel layer, and the material of the solder bump comprises one of lead, tin and silver or an alloy containing any one of the above-mentioned solder metals.

As an example, the antenna module 61 comprises a plurality of antenna units 611 and each antenna unit 611 has the same outer contour.

Specifically, the antenna module 61 comprises at least one antenna unit 611, which may be in block or spiral shape, and of course, the number of the antenna units 611 may be multiple, such as 10 to 100, depending on actual needs. When the number of the antenna units is greater than two, the shapes of different antenna units 611 may be the same or different. In addition, when the antenna unit 611 is a block antenna, the block antenna can be a metal block; and when the antenna unit 611 is a spiral antenna, the spiral antenna may be formed by winding the metal wire into a spiral shape. Preferably, the antenna units have the same outer contour, such that uniform control can be realized which will facilitate a reasonable layout according to actual needs.

In addition, the material of the antenna unit includes, but not limited to, any one of copper, aluminum, nickel, gold, silver, tin and titanium, or a laminated material layer consisting of two or more of the above-mentioned material layers, which may be prepared by adopting any one of physical vapor deposition (PVD), chemical vapor deposition (CVD), sputtering, electroplating, and electroless plating.

As an example, the antenna units 611 are arranged in an array, arranged in a ring shape or irregularly spacing arranged on the second surface 112 of the substrate 11.

As an example, the antenna units 611 are arranged in a hexagonal honeycomb on the second surface 112 of the substrate 11, and a gap exists between any adjacent antenna units 611.

As an example, the shape of each antenna unit 611, on the surface of the substrate 11, is a regular hexagon.

Figure 7:
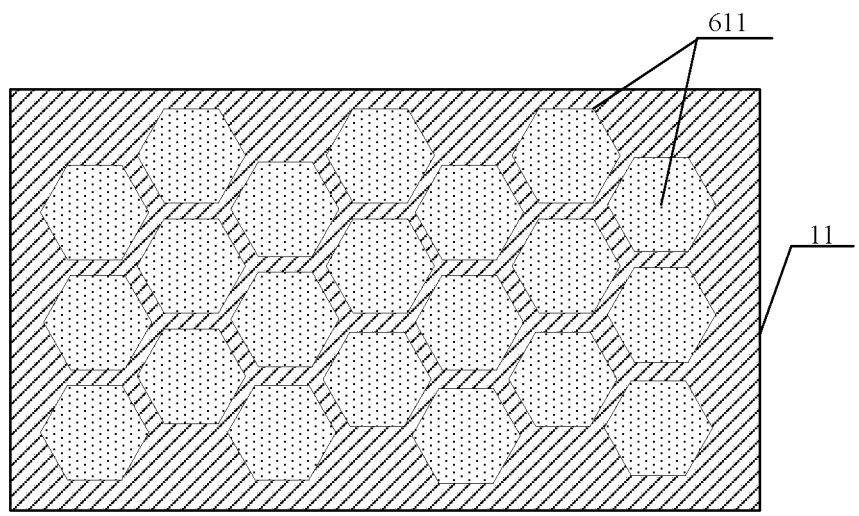
FIG. 7 illustrates a top view of the semiconductor packaging structure having an antenna module according to method disclosed from FIGS. 1-6.

Specifically, a layout of the antenna units 611 is disclosed in this example. As illustrated in FIG. 7, the antenna units are evenly arranged and arranged in a hexagonal honeycomb shape, and a gap exists between the antenna units 611. The process for this design method is simple, the antenna units with the same outer contour do not need any other additional processes, it is suitable for mass production, the antenna signal is uniform and the loss is small. In addition, the gap between adjacent antenna units is set in actual conditions. For example, in the plane where the surface of the substrate is located, the distance between the centers of adjacent antenna units may be arbitrarily set along the longitudinal direction or the horizontal direction perpendicular thereto, and the size of each antenna unit may be arbitrarily selected.

Of course, the arrangement of the antenna units may be configured according to needs, denser antenna units may be set at the desired position, the antenna units may be irregularly arranged, and no specific limitations are made here.

As an example, the antenna module 61 comprises at least two layers of antenna module unit, and each antenna module unit layer comprises at least one antenna unit 611.

Specifically, the antenna module 61 may be formed by a plurality of antenna units 611 arranged in a single layer on the second surface 112 of the substrate 11, or, of course, arranged in a plurality of layers, which comprises two or more antenna unit layers, and then, design of antenna units in a reasonable number and shape is performed on each antenna unit layer, wherein adjacent two antenna unit layers are separated by a dielectric layer, and the electric connection between the different layers is realized by a conductive plug formed in the dielectric layer, such that flexible antenna layout design can be performed according to the specific needs.

To sum up, the present disclosure provides a semiconductor packaging structure having an antenna module, comprising: a substrate having a first surface and a second surface which are opposite to each other; a redistribution layer located on the first surface of the substrate; a metal bump located on one side, insulated from the substrate, of the redistribution layer, and electrically connected with the redistribution layer; a semiconductor chip located on a surface of one side, insulated from the substrate, of the redistribution layer, and electrically connected with the redistribution layer, wherein a spacing is between the semiconductor chip and the metal bump; and an antenna module located on the second surface of the substrate. By adopting the above-mentioned solution, the antenna module and the redistribution layer are provided on two opposite surfaces of the substrate, so that the semiconductor structure having the antenna module provided by the present disclosure has a reasonable packaging layout design; since substrate made of quartz glass has good heat conductivity (about 1.46 for quartz vs 0.2 for plastic), which is about ten times better than that of the plastic packaging material, the problem of heat effect is improved; since the quartz sheet has little warping problem, the chip is further prevented from being easily warped and broken in the subsequent process, the manufacturing is facilitated, and the yield is improved; and the structure provided by the present disclosure is simple, the cost is low, thus it is suitable for mass production. Therefore, the present disclosure effectively overcomes various disadvantages in the prior art and thus has a great industrial utilization value.

The above-mentioned embodiments are only used for exemplarily describing the principle and effects of the present disclosure instead of limiting the present disclosure. One skilled in the art may make modifications or changes to the above-mentioned embodiments without departing from the spirit and scope of the present disclosure. Therefore, all equivalent modifications or changes made by those who have common knowledge in the art without departing from the spirit and technical thought disclosed by the present disclosure shall be still covered by the claims of the present disclosure.

The invention claimed is:

1. A semiconductor packaging structure having an antenna module, comprising:
    a substrate having a first surface and a second surface opposite to the first surface;
    a redistribution layer located on the first surface of the substrate;
    a metal bump located on the redistribution layer, and electrically connected with the redistribution layer;
    a semiconductor chip disposed on and electrically connected with the redistribution layer, wherein a spacing is configured between the semiconductor chip and the metal bump; and
    an antenna module located on the second surface of the substrate.

2. The semiconductor packaging structure having the antenna module according to claim 1, characterized in that the semiconductor packaging structure further comprises an underfill layer, and the underfill layer fully fills a gap between the semiconductor chip and the redistribution layer.

3. The semiconductor packaging structure having the antenna module according to claim 1, characterized in that the substrate comprises a quartz glass substrate or a sapphire substrate.

4. The semiconductor packaging structure having the antenna module according to claim 1, characterized in that the redistribution layer comprises:
    a dielectric layer bonded to the first surface of the substrate;
    one metal wire layer located inside the dielectric layer; and
    an under-bump metal layer located on the dielectric layer, extending to the inside of the dielectric layer and electrically connected with the metal wire layer, wherein the metal bump is provided on the under-bump metal layer.

5. The semiconductor packaging structure having the antenna module according to claim 1, characterized in that the metal bump comprises: a copper pole, a nickel layer located on an upper surface of the copper pole and a solder bump located on the nickel layer.

6. The semiconductor packaging structure having the antenna module according to claim 1, characterized in that the antenna module comprises a plurality of antenna units and each antenna unit has a same outer contour.

7. The semiconductor packaging structure having the antenna module according to claim 6, characterized in that the antenna units are arranged in an array or in a ring shape.

8. The semiconductor packaging structure having the antenna module according to claim 6, characterized in that the antenna units are arranged irregularly on the second surface of the substrate.

9. The semiconductor packaging structure having the antenna module according to claim 6, characterized in that the antenna units are arranged in a hexagonal honeycomb shape on the second surface of the substrate, and each of the antenna units is disposed with a space from adjacent antenna units.

10. The semiconductor packaging structure having the antenna module according to claim 9, characterized in that the shape of the cross section the antenna units comprises a hexagonal shape.

11. The semiconductor packaging structure having the antenna module according to claim 6, characterized in that the antenna module comprises at least two layers of antenna module units, and each layer of the antenna module units at least comprises one antenna unit.

* * * * *